United States Patent
Cois et al.

(10) Patent No.: US 11,372,055 B2
(45) Date of Patent: Jun. 28, 2022

(54) METHOD FOR DETERMINING A RESISTANCE PARAMETER VALUE OF AN ELECTRICAL ENERGY STORAGE UNIT, AND CORRESPONDING DEVICE, COMPUTER PROGRAM, MACHINE-READABLE STORAGE MEDIUM AND ELECTRICAL ENERGY STORAGE UNIT

(71) Applicant: Robert Bosch GmbH, Stuttgart (DE)

(72) Inventors: Olivier Cois, Kernen (DE); Joerg Poehler, Korntal-Muenchingen (DE); Vincent Scharff, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 165 days.

(21) Appl. No.: 16/943,068

(22) Filed: Jul. 30, 2020

(65) Prior Publication Data
US 2021/0033676 A1  Feb. 4, 2021

(30) Foreign Application Priority Data

Aug. 2, 2019 (DE) .................... 10 2019 211 626.4

(51) Int. Cl.
*G01R 31/389* (2019.01)
*G01R 31/367* (2019.01)
*G05F 1/46* (2006.01)

(52) U.S. Cl.
CPC ......... *G01R 31/389* (2019.01); *G01R 31/367* (2019.01); *G05F 1/46* (2013.01)

(58) Field of Classification Search
None
See application file for complete search history.

(56) References Cited

U.S. PATENT DOCUMENTS

2010/0153038 A1   6/2010 Tomura et al.
2015/0070024 A1*  3/2015 Kim ...................... H01M 10/48
                                                    324/430

(Continued)

FOREIGN PATENT DOCUMENTS

DE   102015206048   10/2015
DE   102015108295   12/2015

*Primary Examiner* — Jas A Sanghera
(74) *Attorney, Agent, or Firm* — Michael Best & Friedrich LLP (57) ABSTRACT

A method for determining a resistance parameter value of an electrical energy storage unit is disclosed, comprising the following steps:
a) determining a current variable representing an electric current flowing into or out of the electrical energy storage unit;
b) determining a first voltage variable, which represents an electrical voltage prevailing between two pole terminals of the electrical energy storage unit;
c) determining a second voltage variable, which represents an electrical voltage and results from a mathematical model of the electrical energy storage unit, wherein the current variable determined in step a) is applied to the mathematical model and the latter comprises a resistance parameter which represents an internal resistance of the electrical energy storage unit and to which a first value is allocated;
d) generating an adaptation value for the resistance parameter, wherein the adaptation value is dependent on a difference variable between the first voltage variable and the second voltage variable; and
e) determining a second value of the resistance parameter as a sum of the first value of the resistance parameter and the adaptation value.

16 Claims, 5 Drawing Sheets

(56) References Cited

U.S. PATENT DOCUMENTS

2015/0285867 A1 10/2015 Chang
2015/0355283 A1 12/2015 Lee

* cited by examiner

METHOD FOR DETERMINING A RESISTANCE PARAMETER VALUE OF AN ELECTRICAL ENERGY STORAGE UNIT, AND CORRESPONDING DEVICE, COMPUTER PROGRAM, MACHINE-READABLE STORAGE MEDIUM AND ELECTRICAL ENERGY STORAGE UNIT

BACKGROUND OF THE INVENTION

The present invention is based on a method for determining a resistance parameter of an electrical energy storage unit, and a corresponding device, a corresponding computer program, a corresponding machine-readable storage medium and a corresponding electrical energy storage unit.

In the course of increasing electrification, in particular of motor vehicles, electrical energy storage units are becoming ever more important. In this case, there are various stages of electrification. By way of example, there are vehicles driven purely electrically, and vehicles having an internal combustion engine in which an electric motor performs the drive of the vehicle only at times or supports the internal combustion engine. These different manifestations of electrification typically have different voltage levels and different configurations of the electrical energy storage units used.

What all the embodiments have in common here is that the electrical energy storage units used here are subject to aging effects, which is manifested for example in a change in an internal resistance of the electrical energy storage units. Therefore, internal resistance values for an electrical energy storage unit which are recorded at a predefined point in time and which identify for example the electrical energy storage unit directly after its production or before actual use as an energy store are no longer up to date after a certain time. This can firstly lead to problems in predicting the electrical power retrievable from the electrical energy storage unit, specifically if the retrievable power is overestimated, and also prevent timely replacement of an electrical energy storage unit if the latter contrary to the facts in the system is still indicated as functional or having sufficient performance level.

SUMMARY OF THE INVENTION

In this case, the method for determining a resistance parameter of an electrical energy storage unit involves determining a current variable representing an electric current flowing into or out of the electrical energy storage unit.

In this case, a first voltage variable is determined, which represents an electrical voltage prevailing between two pole terminals of the electrical energy storage unit.

A further step involves determining a second voltage variable, which represents an electrical voltage and results from a mathematical model of the electrical energy storage unit. In this case, the current variable determined is applied to the mathematical model in order thus to yield the second voltage variable as output variable. In this case, the mathematical model comprises a resistance parameter which represents an internal resistance of the electrical energy storage unit and to which a first value is allocated. In this case, the value of the resistance parameter of the mathematical model can have a temperature dependence, in particular be dependent on the temperature of the electrical energy storage unit. The mathematical model can be stored in a data memory, for example. The mathematical model can comprise differential equations or difference equations or algebraic equations, for example. Furthermore, a data-based set of characteristic curves can also be part of the mathematical model.

Furthermore, an adaptation value for the resistance parameter is generated, wherein the adaptation value is dependent on a difference variable between the first voltage variable and the second voltage variable.

A further step involves determining a second, new value of the resistance parameter as the sum of the first value of the resistance parameter and the adaptation value.

This is advantageous since an up to date value for the resistance parameter is thereby ascertained, which—as described above—has an important significance for numerous functions particularly in the case of use in vehicles. Consequently, the method contributes to an improved function of the operation of the electrical energy storage unit and can lengthen the lifetime thereof.

A different implementation order from that described is possible; by way of example, the second voltage variable determined in a model-based manner can be determined before the first voltage variable. By way of example, method steps can also be carried out in parallel, for example determining the first and second voltage variables.

The resistance parameter which represents an internal resistance of the electrical energy storage unit and to which a first value is allocated can in this case characterize both an AC resistance and a DC resistance.

Expediently, current measurement data of the electrical energy storage unit, said data being detected for determining the current variable, are filtered. Alternatively or additionally, the current variable determined is filtered. This is advantageous since the influence of interfering frequencies that occur as a result of high-frequency noise, for example, is thus reduced, which greatly improves the quality of the resistance parameter value determined.

The filtering of the current measurement data is advantageously implemented by means of an analog filter. This is advantageous since discretization effects that corrupt the determining result thus do not occur.

Expediently, the first voltage variable and/or the second voltage variable are/is filtered. This is advantageous since the influence of interfering frequencies that occur as a result of high-frequency noise, for example, is thus reduced, which greatly improves the quality of the resistance parameter value determined. The use of a bandpass filter is conceivable, for example, by means of which specific frequency ranges are filtered out in a targeted manner and only relevant frequency components remain in the voltage variables, for example in order to filter out a DC voltage component.

Expediently, a controller is used for generating the adaptation value. This can be, in particular, a PI controller, that is to say a controller having an integral component. In this case, the controller generates the adaptation value on the basis of the difference variable. This is advantageous since an accurate adaptation value is generated as a result, whereby the result of determining the resistance parameter value is improved.

Expediently, current measurement data of the electrical energy storage unit are detected for determining the current variable by means of a current sensor and/or voltage measurement data of the electrical energy storage unit are detected for determining the first voltage variable by means of a voltage sensor. This is advantageous since the above-mentioned filter operations can be integrated in the corresponding sensors and a less complex implementation of the method is thus afforded.

It is expedient to predict a maximum retrievable electrical power in a predefined time period or a maximum retrievable electric current in a predefined time period for the electrical energy storage unit depending on the second value of the resistance parameter. Furthermore, a power electronic component, in particular a power converter, advantageously an inverter, is driven in such a way that the predicted maximum retrievable electrical power or the predictive maximum retrieval electric current is not exceeded. This is advantageous since accelerated aging or even damage of the electrical energy storage unit is thereby avoided. The maximum retrievable power and/or the maximum retrievable current can be defined for example such that in this case a specific voltage level of the electrical energy storage unit or a specific potential within the electrical energy storage unit, an electrode potential, is not undershot.

It is expedient to determine an aging coefficient on the basis of the second value of the resistance parameter. The aging coefficient is compared with a predefined threshold value and, upon the predefined threshold value being exceeded, a power electronic component is driven in such a way that the electrical energy storage unit is operated with reduced power and/or reduced current. This is advantageous since aging of the electrical energy storage unit is thereby delayed and the lifetime of the electrical energy storage unit is thus increased. The aging coefficient is preferably determined as the quotient of the second value of the resistance parameter and a predefined resistance value. The predefined resistance value can identify for example a delivery state of the electrical energy storage unit.

Furthermore, the subject matter of the disclosure includes a device for determining a resistance parameter value of an electrical energy storage unit, wherein the device comprises at least one means configured to carry out all the steps of the method disclosed. The at least one means can be an electronic control unit, for example, which can also be equipped with and/or connected to corresponding sensors, for example current and voltage sensors. The advantages mentioned above can thus be realized.

An electronic control unit can be understood to mean, in particular, an electronic controller comprising for example a microcontroller and/or an application specific hardware component, e.g. an ASIC, but likewise can encompass a personal computer or a programmable logic controller.

Furthermore, the subject matter of the disclosure includes a computer program comprising instructions which have the effect that the device disclosed carries out all the steps of the method disclosed. The advantages mentioned above can thus be realized.

Furthermore, the subject matter of the disclosure includes a machine-readable storage medium on which the computer program disclosed is stored. The advantages mentioned above can thus be realized.

Furthermore, the subject matter of the disclosure includes an electrical energy storage system comprising at least one electrical energy storage unit and the device disclosed. The advantages mentioned above can thus be realized.

An electrical energy storage unit can be understood to mean, in particular, an electrochemical battery cell and/or a battery module having at least one electrochemical battery cell and/or a battery pack having at least one battery module. For example, the electrical energy storage unit can be a lithium-based battery cell or a lithium-based battery module or a lithium-based battery pack. In particular, the electrical energy storage unit can be a lithium-ion battery cell or a lithium-ion battery module or a lithium-ion battery pack. Furthermore, the battery cell can be of the lithium-polymer rechargeable battery, nickel-metal hydride rechargeable battery, lad acid rechargeable battery, lithium-air rechargeable battery or lithium-sulfur rechargeable battery type or very generally a rechargeable battery of arbitrary electrochemical composition. A capacitor, too, is possible as electrical energy storage unit.

BRIEF DESCRIPTION OF THE DRAWINGS

Advantageous embodiments of the invention are illustrated in the figures and explained in greater detail in the following description.

In the figures.

DETAILED DESCRIPTION

Identical reference signs designate identical device components or identical method steps in all the figures.

Figure 1:
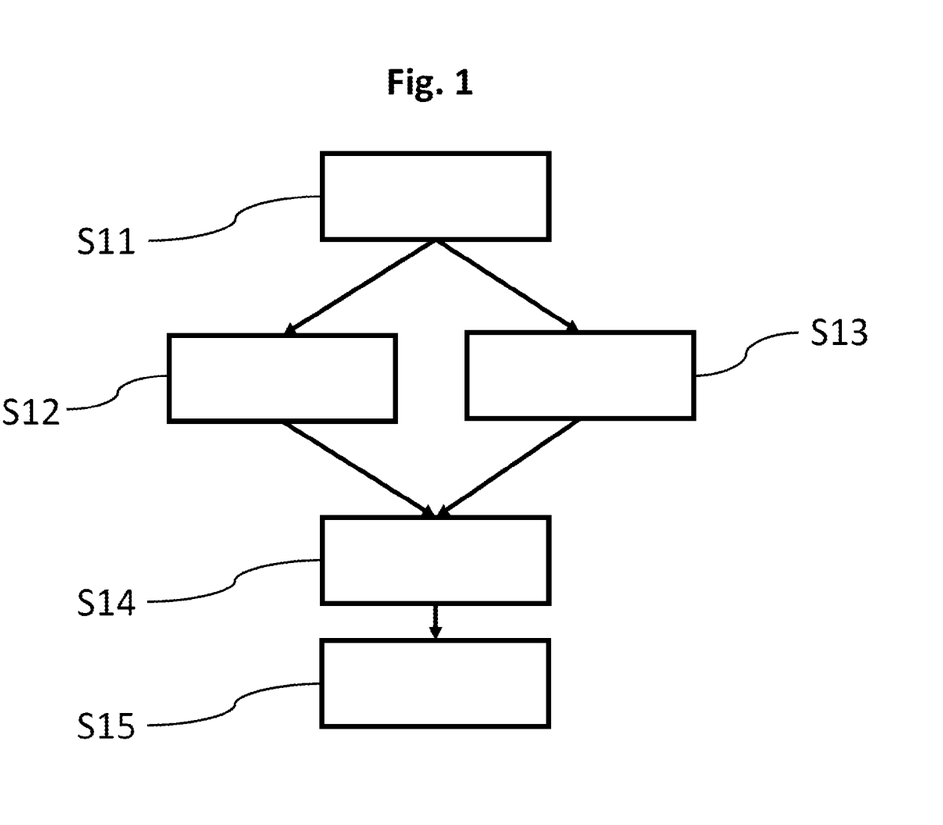
FIG. 1 shows a flow diagram of the disclosed method in accordance with a first embodiment.

FIG. 1 shows a flow diagram of the disclosed method in accordance with a first embodiment. The method serves for determining a resistance parameter of an electrical energy storage unit.

A first step S11 involves determining a current variable, wherein the current variable represents an electric current flowing into or out of the electrical energy storage unit.

A second step S12 involves determining a first voltage variable, which represents an electrical voltage prevailing between two pole terminals of the electrical energy storage unit.

A third step S13 involves determining a second voltage variable, which represents an electrical voltage and results from a mathematical model of the electrical energy storage unit. In this case, the current variable determined is applied to the mathematical model. The mathematical model comprises a resistance parameter having a first value. As output variable, the mathematical model yields a second voltage variable which is therefore not determined at the real electrical energy storage unit, but rather in a simulative manner by means of a model.

As is evident from the flow diagram, the second step S12 and the third step S13 are carried out in parallel. Alternatively, it is also possible for said steps to be carried out sequentially.

A fourth step S14 involves generating an adaptation value for the resistance parameter. The adaptation value is dependent on a difference variable between the first voltage variable and the second voltage variable.

A fifth step S15 involves determining a second value of the resistance parameter. In this case, the second value results as the sum of the first value of the resistance parameter and of the adaptation value that was determined in the fourth step S14.

Figure 2:
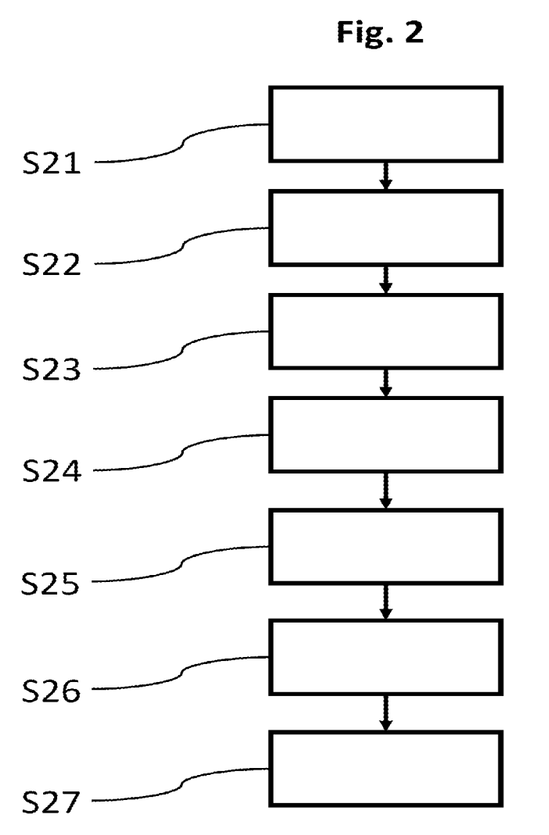
FIG. 2 shows a flow diagram of the disclosed method in accordance with a second embodiment.

FIG. 2 shows a flow diagram of the disclosed method in accordance with a second embodiment. The method is used for determining a resistance parameter of an electrical energy storage unit.

A first step S21 involves digitally filtering current measurement data that were detected for determining the current variable. This can be effected for example in an electronic control unit on which the disclosed method is implemented. In this case, the current measurement data reproduce an electric current flowing into or out of the electrical energy storage unit.

A second step S22 involves determining a current variable, that being done depending on the current measurement data filtered in the first step S21.

A third step S23 involves determining a first voltage variable, which represents an electrical voltage prevailing between two pole terminals of the electrical energy storage unit.

A fourth step S24 involves determining a second voltage variable, which represents an electrical voltage and results from a mathematical model of the electrical energy storage unit. In this case, the current variable determined is applied to the mathematical model. The mathematical model comprises a resistance parameter having a first value. As output variable, the mathematical model yields a second voltage variable which is therefore not determined at the real electrical energy storage unit, but rather in a simulative manner by means of a model.

A fifth step S25 involves filtering the first voltage variable and the second voltage variable, preferably by means of a bandpass filter, in order to filter out in particular high-frequency interference components and DC components.

A sixth step S26 involves generating an adaptation value for the resistance parameter. The adaptation value is dependent on a difference variable between the first voltage variable and the second voltage variable. Said difference variable can vary for example in the range of a few millivolts, for example between 0 mV and 100 mV.

A seventh step S27 involves calculating a second or changed value of the resistance parameter, wherein the second value results as the sum of the first value of the resistance parameter and of the adaptation value.

Figure 3:
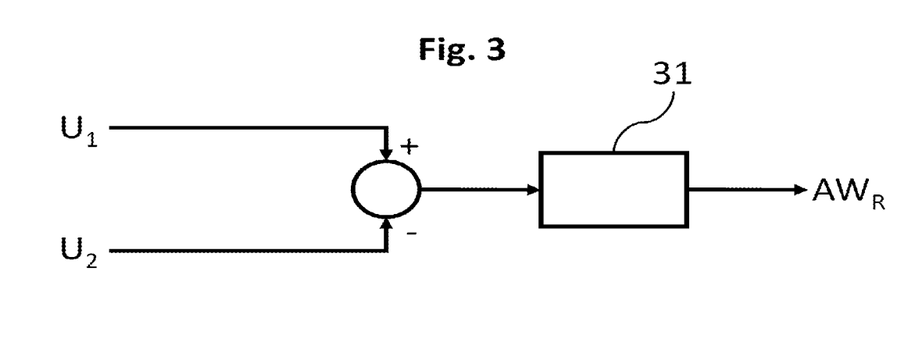
FIG. 3 shows a schematic illustration of the generation of the adaptation value by means of a controller in accordance with one embodiment.

FIG. 3 shows a schematic illustration of the generation of the adaptation value with a controller in accordance with one embodiment. Proceeding from a first voltage variable $U_1$ and a second voltage variable $U_2$, a difference variable is determined. The difference variable forms an input variable for a controller 31. The controller 31 determines an output variable $AW_R$ from the input variable. In this case, the determination is dependent on the specific embodiment of the controller, for example as a PI controller. In this case, the controller is preferably implemented digitally, for example on an electronic control unit.

Figure 4:
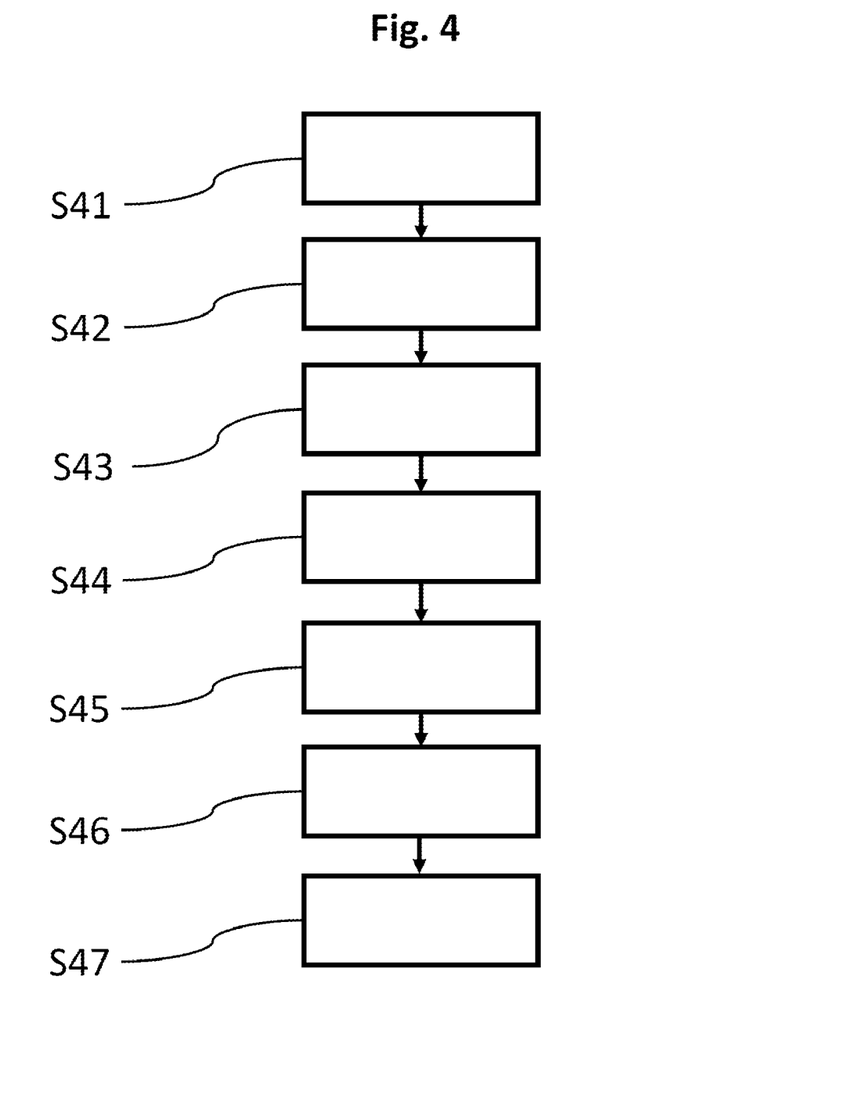
FIG. 4 shows a flow diagram of the disclosed method in accordance with a third embodiment.

FIG. 4 shows a flow diagram of the disclosed method in accordance with a third embodiment. The method serves for determining a resistance parameter of an electrical energy storage unit.

A first step S41 involves determining a current variable, wherein the current variable represents an electric current flowing into or out of the electrical energy storage unit.

A second step S42 involves determining a second voltage variable, which represents an electrical voltage and results from a mathematical model of the electrical energy storage unit. In this case, the current variable determined is applied to the mathematical model. The mathematical model comprises a resistance parameter having a first value. As output variable, the mathematical model yields a second voltage variable which is therefore not determined at the real electrical energy storage unit, but rather in a simulative manner by means of a model.

A third step S43 involves determining a first voltage variable, which represents an electrical voltage prevailing between two pole terminals of the electrical energy storage unit.

A fourth step S44 involves generating an adaptation value for the resistance parameter. The adaptation value is dependent on a difference variable between the first voltage variable and the second voltage variable.

A fifth step S45 involves determining a second value of the resistance parameter. In this case, the second value results as the sum of the first value of the resistance parameter and of the adaptation value that was determined in the fourth step S44.

In a sixth step S46, a maximum electrical power retrievable from the electrical energy storage unit in a predefined time period or a maximum electric current retrievable from the electrical energy storage unit in the predefined time period is predicted in each case depending on the second value of the resistance parameter, that is to say is predetermined for the predefined time period. In this case, in particular, a lower voltage level of the electrical energy storage unit is complied with. Further conditions are additionally possible for the prediction, for example a maximum permissible temperature increase.

A seventh step S47 involves driving a power electronic component, for example a power converter, in particular an inverter, in such a way that the predicted maximum retrievable electrical power or the predicted maximum retrievable electric current is not exceeded. Damage and thus undesired aging of the electrical energy storage unit is advantageously avoided as a result.

Figure 5:
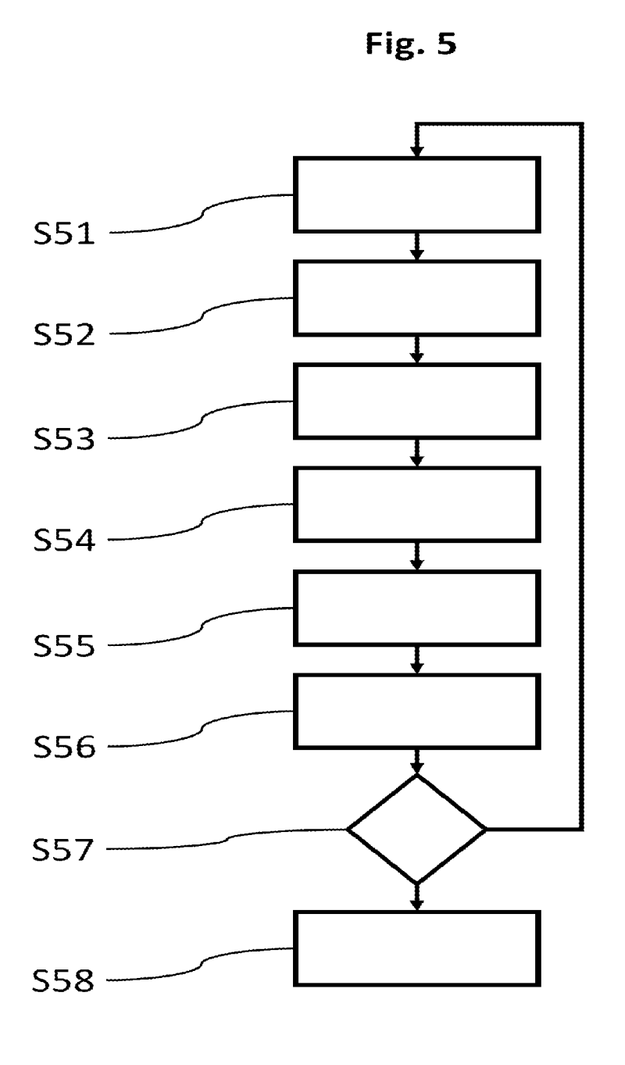
FIG. 5 shows a flow diagram of the disclosed method in accordance with a fourth embodiment.

FIG. 5 shows a flow diagram of the method according to the invention in accordance with a fourth embodiment. The method is used for determining a resistance parameter of an electrical energy storage unit.

A first step S51 involves determining a current variable, wherein the current variable represents an electric current flowing into or out of the electrical energy storage unit.

A second step S52 involves determining a first voltage variable, which represents an electrical voltage prevailing between two pole terminals of the electrical energy storage unit.

A third step S53 involves determining a second voltage variable, which represents an electrical voltage and results from a mathematical model of the electrical energy storage unit. In this case, the current variable determined is applied to the mathematical model. The mathematical model comprises a resistance parameter having a first value. As output variable, the mathematical model yields a second voltage variable which is therefore not determined at the real electrical energy storage unit, but rather in a simulative manner by means of a model. The mathematical model can be implemented for example in the form of a difference equation for numerical calculation on an electronic control unit.

A fourth step S54 involves generating an adaptation value for the resistance parameter. The adaptation value is dependent on a difference variable between the first voltage variable and the second voltage variable.

A fifth step S55 involves determining a second value of the resistance parameter. In this case, the second value results as the sum of the first value of the resistance parameter and of the adaptation value that was determined in the fourth step S54.

A sixth step S56 involves determining an aging coefficient based on the second value of the resistance parameter. This is done for example by quotient formation as follows:

$$SOH_R = R_n / R_{BOL}$$

In this case, $R_n$ denotes the second value of the resistance parameter and $R_{BOL}$ denotes a reference value that was determined for example shortly after the production of the electrical energy storage unit.

A seventh step S57 involves comparing the value of the aging coefficient with a predefined threshold value. The resistance or the internal resistance of an electrical energy storage unit typically rises with increasing age. This means that by comparing the aging coefficient with the predefined threshold value, it is possible to make a statement about the state of health of the electrical energy storage unit. If the value of the aging coefficient does not exceed the threshold value, that is to say if there is no aging assessed as excessive, the method continues with the first step S51 again.

If the value of the aging coefficient exceeds the predefined threshold value, an eighth step S58 involves driving a power electronic component, in particular an inverter, in such a way that the electrical energy storage unit is operated only with reduced power or respectively reduced current. In this regard, in a targeted manner, the aging of the electrical energy storage unit is slowed down and the lifetime thereof is increased.

Figure 6:
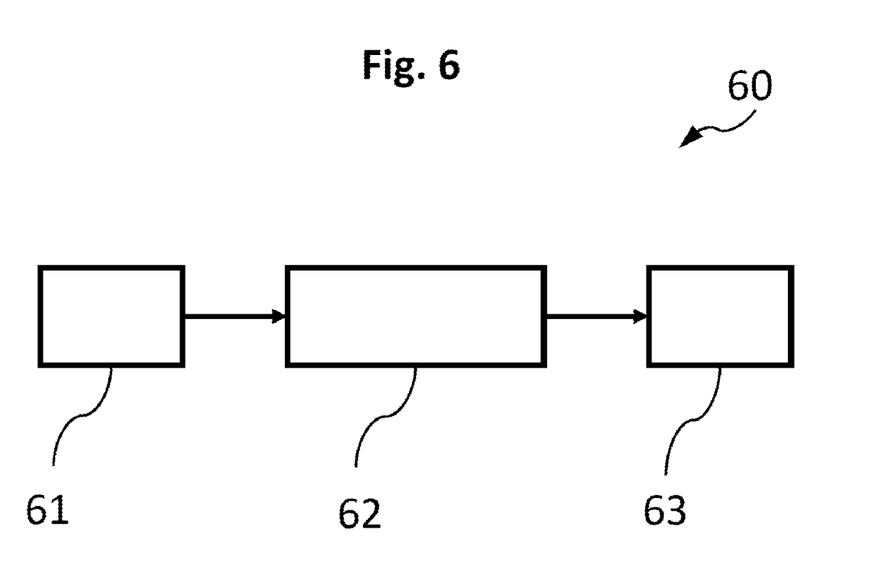
FIG. 6 shows a schematic illustration of the disclosed device in accordance with one embodiment.

FIG. 6 shows a schematic device of the disclosed electrical energy storage system 60 in accordance with one embodiment. In this case, the electrical energy storage system 60 comprises at least one electrical energy storage unit (not illustrated here), sensors 61, a device 62 and a power electronic component 63.

In this case, the device 62 can exchange data with the connected sensors 61, for example voltage and current sensors. Only unidirectional reception of data from the connected sensors 61 is also possible. Furthermore, the device 62 can drive the connected power electronic component 63 in order that current limits, for example, are complied with. The power electronic component 63 can be an inverter, for example.

In this case, the device 62 comprises an electronic control unit, for example, which is not illustrated in FIG. 6. The device 62 can also comprise further electronic control units.

The invention claimed is:

1. A method for determining a resistance parameter value of an electrical energy storage unit, comprising the following steps:
   a) determining a current variable representing an electric current flowing into or out of the electrical energy storage unit;
   b) determining a first voltage variable, which represents an electrical voltage prevailing between two pole terminals of the electrical energy storage unit;
   c) determining a second voltage variable, which represents an electrical voltage and results from a mathematical model of the electrical energy storage unit, wherein the current variable determined in step a) is applied to the mathematical model and the latter comprises a resistance parameter which represents an internal resistance of the electrical energy storage unit and to which a first value is allocated;
   d) generating an adaptation value for the resistance parameter, wherein the adaptation value is dependent on a difference variable between the first voltage variable and the second voltage variable; and
   e) determining a second value of the resistance parameter as a sum of the first value of the resistance parameter and the adaptation value.

2. The method according to claim 1, furthermore comprising:
   f) filtering current measurement data of the electrical energy storage unit, said data being detected for determining the current variable, filtering the current variable, or both.

3. The method according to claim 2, furthermore comprising:
   g) filtering the first voltage variable, and/or the second voltage variable, or both.

4. The method according to claim 3, wherein a controller having an integral component is used for generating the adaptation value.

5. The method according to claim 4, wherein current measurement data of the electrical energy storage unit are detected for determining the current variable by a current sensor, voltage measurement data of the electrical energy storage unit are detected for determining the first voltage variable by a voltage sensor, or both.

6. The method according to claim 5, furthermore comprising:
   h) predicting a maximum retrievable electrical power in a predefined time period or a maximum retrievable electric current in a predefined time period for the electrical energy storage unit depending on the second value of the resistance parameter; and
   i) driving a power electronic component (63) in such a way that the predicted maximum retrievable electrical power or the predicted maximum retrievable electric current is not exceeded.

7. The method according to claim 6, furthermore comprising:
   j) determining an aging coefficient on the basis of the second value of the resistance parameter;
   k) comparing the aging coefficient with a predefined threshold value; and
   l) upon the predefined threshold value being exceeded, driving a power electronic component (63) in such a way that the electrical energy storage unit is operated with reduced power or reduced current.

8. A device (62) for determining a resistance parameter value of an electrical energy storage unit, an electronic control unit configured to carry out all the steps of the method according to claim 7.

9. The method according to claim 1, furthermore comprising:
   g) filtering the first voltage variable, the second voltage variable, or both.

10. The method according to claim 1, wherein a controller having an integral component is used for generating the adaptation value.

11. The method according to claim 1, wherein current measurement data of the electrical energy storage unit are detected for determining the current variable by a current sensor, voltage measurement data of the electrical energy storage unit are detected for determining the first voltage variable by a voltage sensor, or both.

12. The method according to claim 1, furthermore comprising:
   h) predicting a maximum retrievable electrical power in a predefined time period or a maximum retrievable electric current in a predefined time period for the electrical energy storage unit depending on the second value of the resistance parameter; and i) driving a power electronic component (63) in such a way that the predicted maximum retrievable electrical power or the predicted maximum retrievable electric current is not exceeded.

13. The method according to claim 1, furthermore comprising:

j) determining an aging coefficient on the basis of the second value of the resistance parameter;

k) comparing the aging coefficient with a predefined threshold value; and l) upon the predefined threshold value being exceeded, driving a power electronic component (63) in such a way that the electrical energy storage unit is operated with reduced power or reduced current.

14. A device (62) for determining a resistance parameter value of an electrical energy storage unit, comprising an electronic control unit, which is configured to carry out all the steps of the method according to claim 1.

15. An electrical energy storage system (60) comprising at least one electrical energy storage unit and a device (62) according to claim 14.

16. A non-transitory machine-readable storage medium storing instructions that, when executed by a computer, cause the computer to:

a) determine a current variable representing an electric current flowing into or out of the electrical energy storage unit;

b) determine a first voltage variable, which represents an electrical voltage prevailing between two pole terminals of the electrical energy storage unit;

c) determine a second voltage variable, which represents an electrical voltage and results from a mathematical model of the electrical energy storage unit, wherein the current variable determined in step a) is applied to the mathematical model and the latter comprises a resistance parameter which represents an internal resistance of the electrical energy storage unit and to which a first value is allocated;

d) generate an adaptation value for the resistance parameter, wherein the adaptation value is dependent on a difference variable between the first voltage variable and the second voltage variable; and e) determine a second value of the resistance parameter as a sum of the first value of the resistance parameter and the adaptation value.

\* \* \* \* \*